(12) United States Patent
Lin et al.

(10) Patent No.: US 11,094,900 B2
(45) Date of Patent: Aug. 17, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Chin-Chia Yang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/241,997

(22) Filed: Jan. 8, 2019

(65) Prior Publication Data

US 2020/0185629 A1 Jun. 11, 2020

(30) Foreign Application Priority Data

Dec. 10, 2018 (CN) .......................... 201811503263.9

(51) Int. Cl.
*H01L 51/05* (2006.01)
*H01L 51/00* (2006.01)
*H01L 51/10* (2006.01)

(52) U.S. Cl.
CPC ...... *H01L 51/0575* (2013.01); *H01L 51/0023* (2013.01); *H01L 51/0048* (2013.01); *H01L 51/102* (2013.01)

(58) Field of Classification Search
CPC ............. H01L 51/0575; H01L 51/0023; H01L 51/0048; H01L 51/102
See application file for complete search history.

(56) References Cited

U.S. PATENT DOCUMENTS

| 9,159,418 | B1 | 10/2015 | Ward et al. | |
|---|---|---|---|---|
| 2006/0270227 | A1* | 11/2006 | Lin | H01L 21/76877 438/687 |
| 2008/0308308 | A1* | 12/2008 | Kobayashi | H01L 21/6835 174/257 |
| 2009/0121219 | A1* | 5/2009 | Song | C01B 32/162 257/43 |
| 2009/0278112 | A1* | 11/2009 | Schricker | H01L 27/2409 257/9 |
| 2010/0001267 | A1 | 1/2010 | Manning et al. | |
| 2011/0297426 | A1* | 12/2011 | Sunohara | H01L 23/49822 174/251 |
| 2013/0256621 | A1* | 10/2013 | Park | H01L 27/2409 257/2 |

* cited by examiner

*Primary Examiner* — Farun Lu
(74) *Attorney, Agent, or Firm* — Winston Hsu

(57) ABSTRACT

A method for fabricating semiconductor device includes the steps of: forming a first metal interconnection in a first inter-metal dielectric (IMD) layer; performing a treatment process to rough a top surface of the first metal interconnection; and forming a carbon nanotube (CNT) junction on the first metal interconnection. Preferably, the treatment process further includes forming protrusions on the top surface of the first metal interconnection, in which the protrusions and the first metal interconnection comprise same material.

12 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating semiconductor device having carbon nanotube (CNT) junction.

2. Description of the Prior Art

In the past four decades, semiconductor industries keep downscaling the size of MOSFETs in order to achieve the goals of high operation speed and high device density. However, the reduction of device size won't last forever. When transistor shrink into or below 30 nm regime, leakage current due to severe short channel effects and thin gate dielectric causes the increase of off-state power consumption, and consequently causes functionality failure. One-dimensional devices based on nanowires or nanotubes are considered the immediate successors to replace the traditional silicon technology with relatively low technological risk. Nanowire transistor, which has higher carrier mobility and can be further enhanced by quantum confinement effect, is one of the most promising devices. In addition, the control of gate to channel can also be improved by using high-k dielectric layers.

SUMMARY OF THE INVENTION

According to an embodiment of the present invention, a method for fabricating semiconductor device includes the steps of: forming a first metal interconnection in a first inter-metal dielectric (IMD) layer; performing a treatment process to rough a top surface of the first metal interconnection; and forming a carbon nanotube (CNT) junction on the first metal interconnection. Preferably, the treatment process further includes forming protrusions on the top surface of the first metal interconnection, in which the protrusions and the first metal interconnection comprise same material.

According to another aspect of the present invention, a semiconductor device preferably includes a first metal interconnection in a first inter-metal dielectric (IMD) layer, protrusions on the first metal interconnection, and a carbon nanotube (CNT) junction on the protrusions. Preferably, the CNT junction includes a bottom electrode layer on the protrusions and the first metal interconnection, a CNT layer on the bottom electrode layer, and a top electrode layer on the CNT layer, in which a top surface of the protrusions is higher than a top surface of the first IMD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
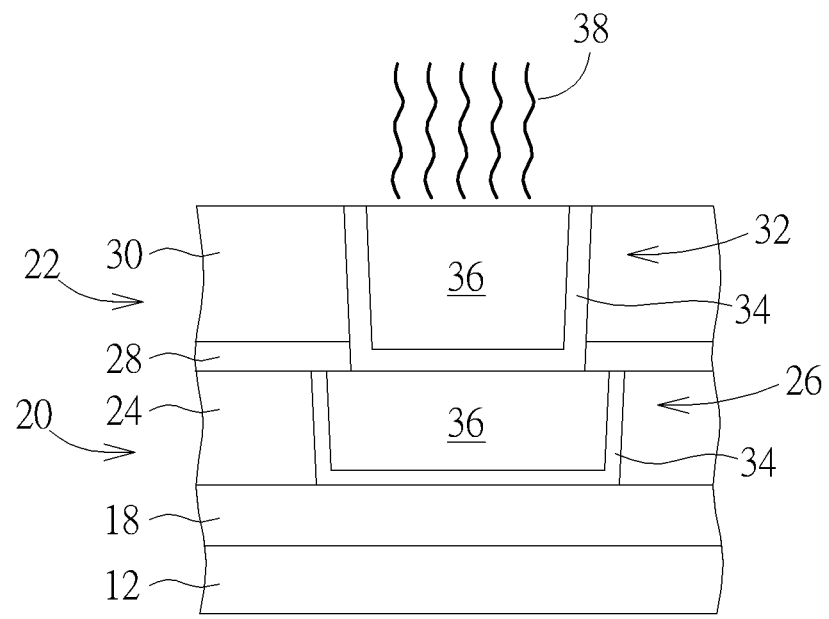
FIGS. 1-9 illustrate a method for fabricating a semiconductor device according to an embodiment of the present invention.

Referring to FIGS. 1-9, FIGS. 1-9 illustrate a method for fabricating a semiconductor device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs).

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 to electrically connect the aforementioned contact plugs, in which the metal interconnect structure 20 includes an inter-metal dielectric (IMD) layer 24 and metal interconnection 26 embedded in the IMD layer 24, and the metal interconnect structure 22 includes a stop layer 28, an IMD layer 30, and metal interconnection 32 embedded in the stop layer 28 and the IMD layer 30.

In this embodiment, the metal interconnection 26 from the metal interconnect structure 20 preferably includes a trench conductor and the metal interconnection 32 from the metal interconnect structure includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper or tungsten, the IMD layers 24 is preferably made of ultra low-k (ULK) dielectric material such as porous silicon oxide, the IMD layer 30 is preferably made of plasma-enhanced silicon oxide, and the stop layers 28 is preferably made of nitrogen doped carbide (NDC), silicon nitride, silicon carbon nitride (SiCN), or combination thereof.

Next, a treatment process 38 is conducted to alter the surface characteristics or surface structure of the metal interconnection 32. Specifically, the treatment process 38 conducted at the stage preferably includes a NH₃ plasma treatment process to roughen the top surface of the metal interconnection 32 so that the surface profile of the top surface of the metal interconnection 32 is preferably transformed from planar surface to a rough surface after the plasma bombardment process.

Figure 2:
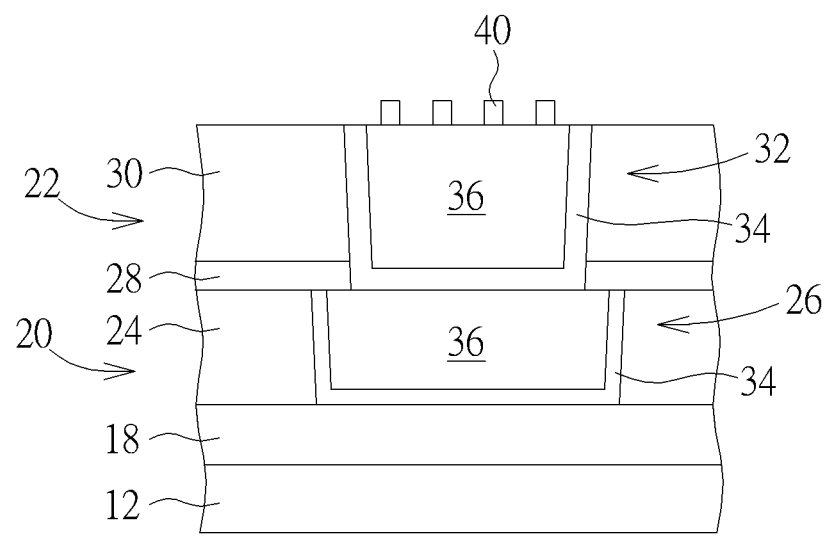

Next, as shown in FIG. 2, the top surface of the metal interconnection 32 after being roughened by the NH₃ plasma treatment process is preferably transformed from a planar surface to non-planar surface. Viewing from a more detailed perspective, the roughening step achieved by the NH₃ plasma treatment process preferably removes part of the surface of the metal layer 36 of metal interconnection 32 and forms a plurality of protrusions 40 on the top surface of metal interconnection 32. Preferably, the top surface of the protrusions 40 is higher than the top surface of the IMD layer 30 on adjacent two sides and the protrusions 40 and the metal layer 36 are preferably made of same material including but not limited to for example copper (Cu) or tungsten (W).

Figure 3:
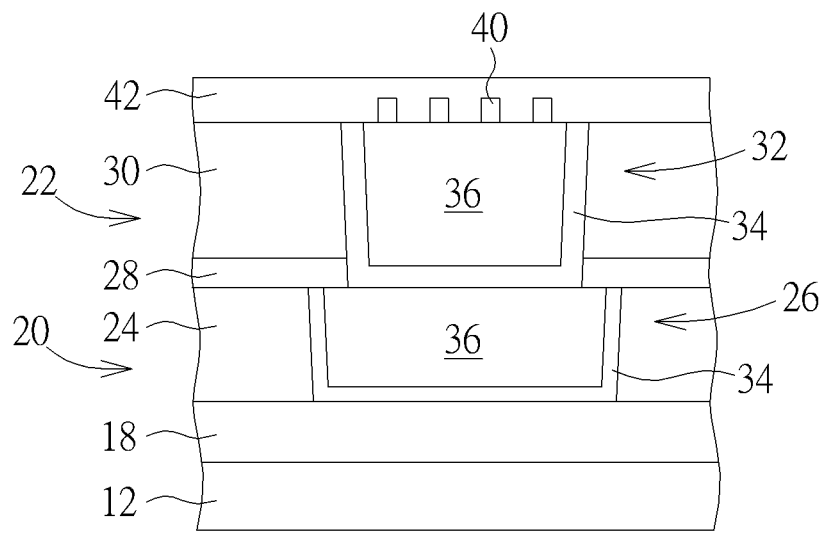

Next, as shown in FIG. 3, a bottom electrode layer 42 is formed on the IMD layer 30, the protrusions 40, and metal interconnection 32. In this embodiment, the bottom electrode layer 42 is preferably made of metal or metal nitride such as titanium nitride (TiN). Nevertheless, according to other embodiments of the present invention, the bottom electrode layer 42 could also include other material such as Ta or TaN.

Figure 4:
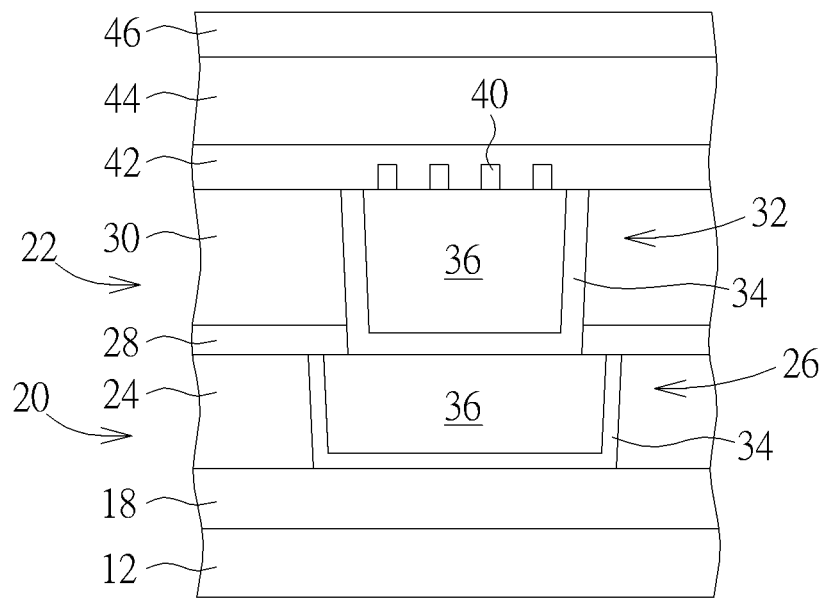

Next, as shown in FIG. 4, a CNT layer 44 is formed on the bottom electrode layer 42 and a top electrode layer 46 is formed on the CNT layer 44. In this embodiment, the CNT layer 44 could formed by chemical vapor deposition (CVD) process and the bottom electrode layer 42 and the top electrode layer 46 preferably include same material such as TiN. Nevertheless, according to other embodiments of the present invention, the two electrode layers 42, 46 could also be made of Ta or TaN, which are all within the scope of the present invention.

Figure 5:
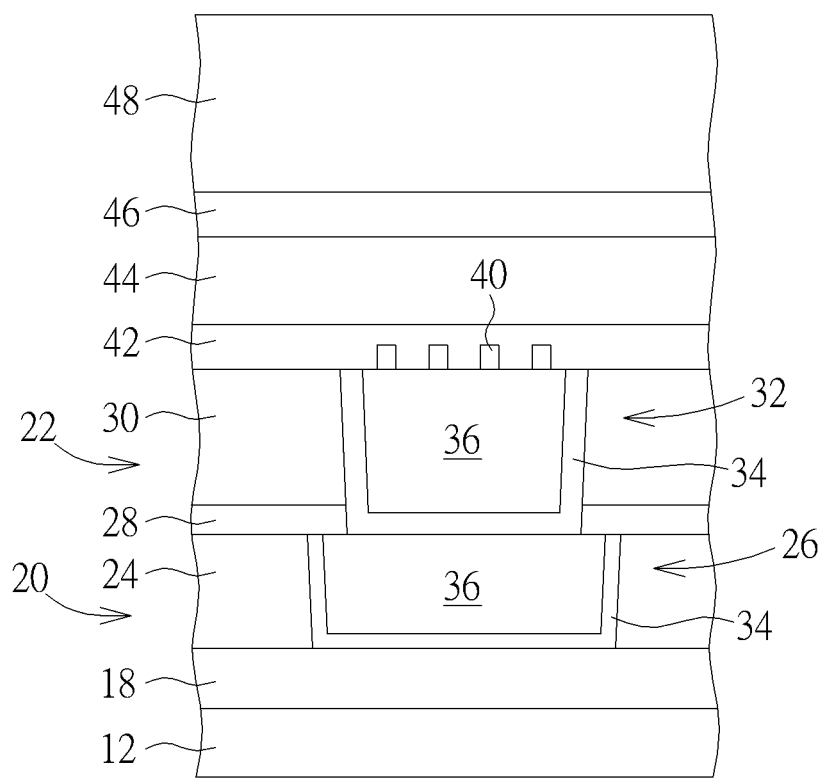

Next, as shown in FIG. 5, a cap layer 48 is formed on the surface of the top electrode layer 46. In this embodiment, the cap layer 48 is preferably made of dielectric material including but not limited to for example silicon oxide, silicon nitride, silicon oxynitride (SiON), or silicon carbon nitride (SiCN).

Figure 6:
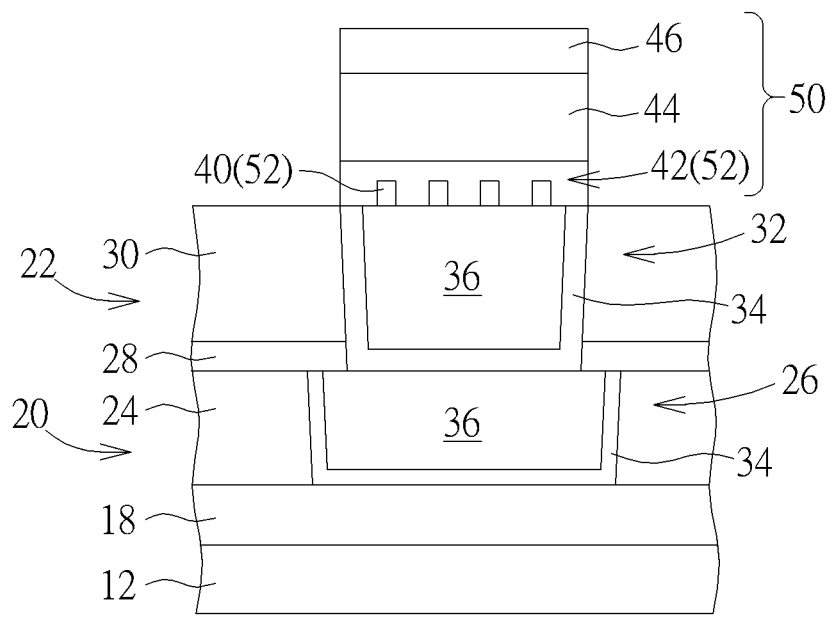

Next, as shown in FIG. 6, a photo-etching process is conducted to pattern the cap layer 48, the top electrode layer 46, the CNT layer 44, and the bottom electrode layer 42. In this embodiment, the patterning process could be accomplished by first forming a patterned mask (not shown) such as a patterned resist on the surface of the cap layer 48, and one or multiple etching process could be conducted by using the patterned mask as mask to remove part of the cap layer 48, part of the top electrode layer 46, part of the CNT layer 44, and part of the bottom electrode layer 42, in which the patterned top electrode layer 46, CNT layer 44, and bottom electrode layer 42 together constitute a CNT junction 50 on the metal interconnection 32. The patterned mask and cap layer 48 are then removed thereafter to expose the surface of the top electrode layer 46.

It should be noted that even though the two sidewalls of the CNT junction 50 is aligned with the sidewalls of the metal interconnection 32 underneath, according to other embodiments of the present invention, the two sidewalls of the CNT junction 50 could also not align with the two sidewalls of the metal interconnection 32 depending on the demand of the product. For instance, the width of the CNT junction 50 could be greater than or less than the width of the metal interconnection 32 while the bottom surface of the CNT junction 50 could overlap only one sidewall or even two sidewalls of the metal interconnection 32, which are all within the scope of the present invention. Moreover, the bottom electrode layer 42 being patterned at this stage and the protrusions 40 formed on surface of the metal interconnection 32 could together constitute a new bottom electrode layer 52 while serving as a bottom electrode for the CNT junction 50.

Figure 7:
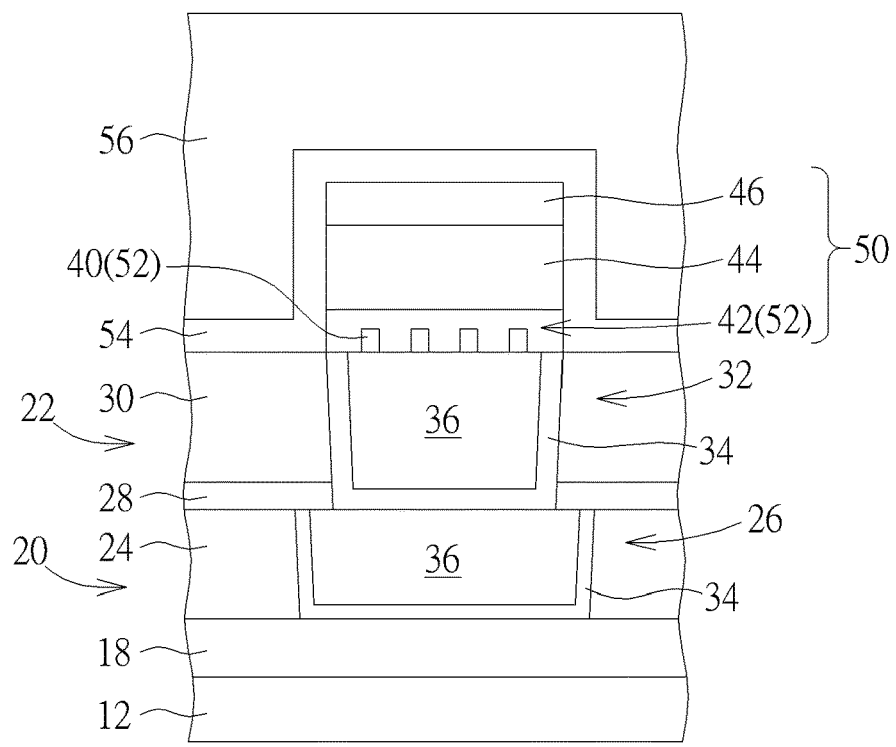

Next, as shown in FIG. 7, a cap layer 54 is formed on the IMD layer 30 and the CNT junction 50, in which the cap layer 54 preferably covers and/or directly contacts the top surface of the IMD layer 30 and top surface and sidewalls of the CNT junction 50. Next, another IMD layer 56 is formed on the cap layer 54 thereafter. Preferably, the IMD layer 56 and the IMD layer 24 underneath are preferably made of same material such as ULK dielectric material including but not limited to for example porous silicon oxide.

Figure 8:
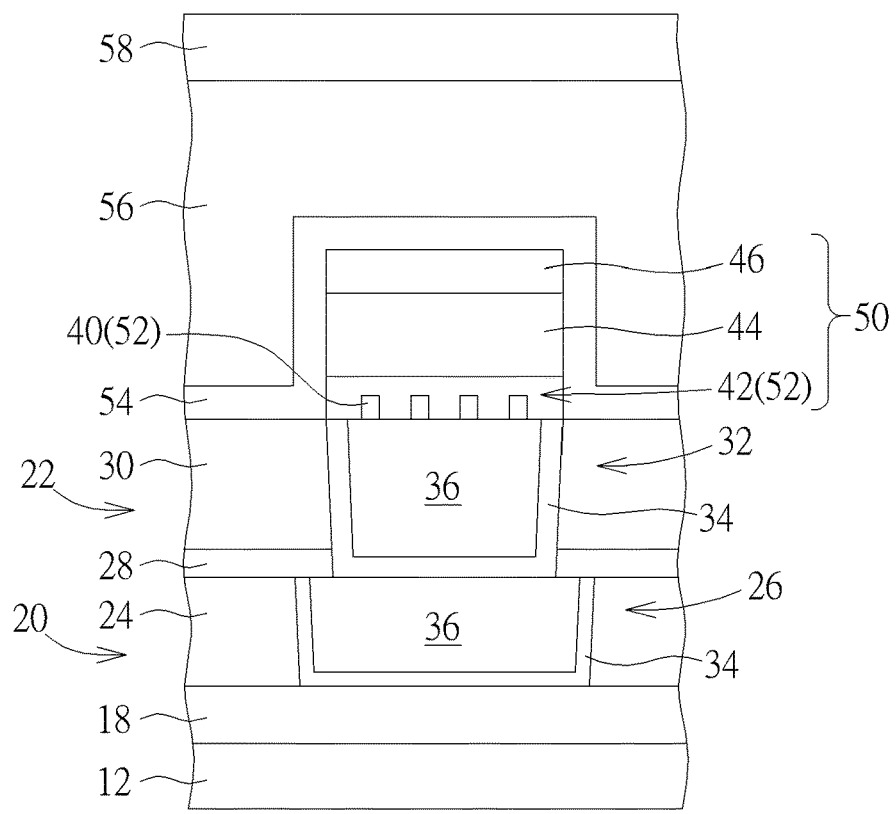

Next, as shown in FIG. 8, another cap layer 58 could be formed on the surface of the IMD layer 56. In this embodiment, the cap layer 58 and the cap layer 48 formed in FIG. 5 could be made of same dielectric material including but not limited to for example silicon oxide, silicon nitride, silicon oxynitride (SiON), or silicon carbon nitride (SiCN).

Figure 9:
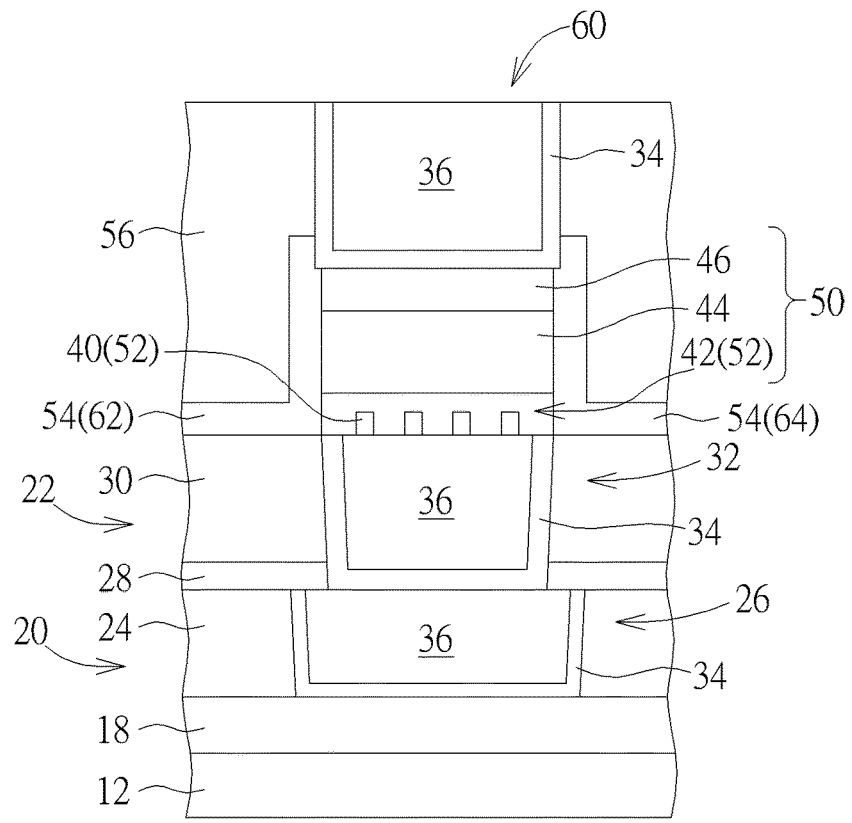

Next, as shown in FIG. 9, a photo-etching process is conducted to remove part of the cap layer 58, part of the IMD layer 56, and part of the cap layer 54 to form a trench (not shown) exposing the top surface of the CNT junction 50, and conductive materials are deposited into the trench accompanied by a planarizing process such as chemical mechanical polishing (CMP) process to form another metal interconnection 60 electrically connecting the CNT junction 50. Similar to the metal interconnection 32 in the metal interconnect structure 22, the metal interconnection 60 formed at this stage could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP).

It should be noted that similar to the aforementioned connection between the CNT junction 50 and the metal interconnection underneath, even though the two sidewalls of the metal interconnection 60 are not aligned with the two sidewalls of the CNT junction 50 underneath while the width of the metal interconnection 60 is also slightly greater than the width of the CNT junction 50, according to another embodiment of the present invention, the two sidewalls of the metal interconnection 60 could also be aligned with the two sidewalls of the CNT junction 50 and/or the width of the metal interconnection 60 is less than the width of the CNT junction 50, which are all within the scope of the present invention.

Referring again to FIG. 9, FIG. 9 further illustrates a structural view of a semiconductor device according to an embodiment of the present invention. As shown in FIG. 9, the semiconductor device preferably includes a metal interconnection 32 disposed in the IMD layer 32, multiple protrusions 40 disposed on the top surface of the metal interconnection 32, a CNT junction 50 disposed on the metal interconnection 32, another metal interconnection 60 disposed on the CNT junction 50, a cap layer 54 disposed on the sidewalls of the CNT junction 50 and on the IMD layer 30, and another IMD layer 56 disposed on the cap layer 54 and surround the metal interconnection 60. Preferably, the CNT junction 50 further includes a bottom electrode layer 42 disposed on the protrusions 40 and the metal interconnection 32, a CNT layer 44 disposed on the bottom electrode layer 42, and a top electrode layer 46 disposed on the CNT layer 44.

Viewing from a more detailed perspective, the protrusions 40 disposed on the top surface of the metal interconnection 32 and the bottom electrode layer 42 of the CNT junction 50 preferably constitute another bottom electrode layer 52 together, the top surfaces of the protrusions 40 are preferably higher than the top surface of the IMD layer 30, the top surface of the metal interconnection 32 disposed directly under and/or adjacent to two sides of the protrusions 40 is even with the top surface of the surrounding IMD layer 30, and the protrusions 40 and the metal layer 36 of the metal interconnection 32 are preferably made of same material such as Cu or W. Preferably, the cap layer 54 includes a first L-shaped portion 62 disposed on one side of the CNT junction 50 and a second L-shaped portion 64 disposed on another side of the CNT junction 50, in which the first L-shaped portion 62 and second L-shaped portion 64 directly contact the sidewalls of the CNT junction 52 and top surface of the IMD layer 30, and the top or topmost surface of each of the first L-shaped portion 62 and second L-shaped portion 64 could be higher than, even with, or lower than the top surface of the top electrode layer 46 of the CNT junction 50.

Figure 10:
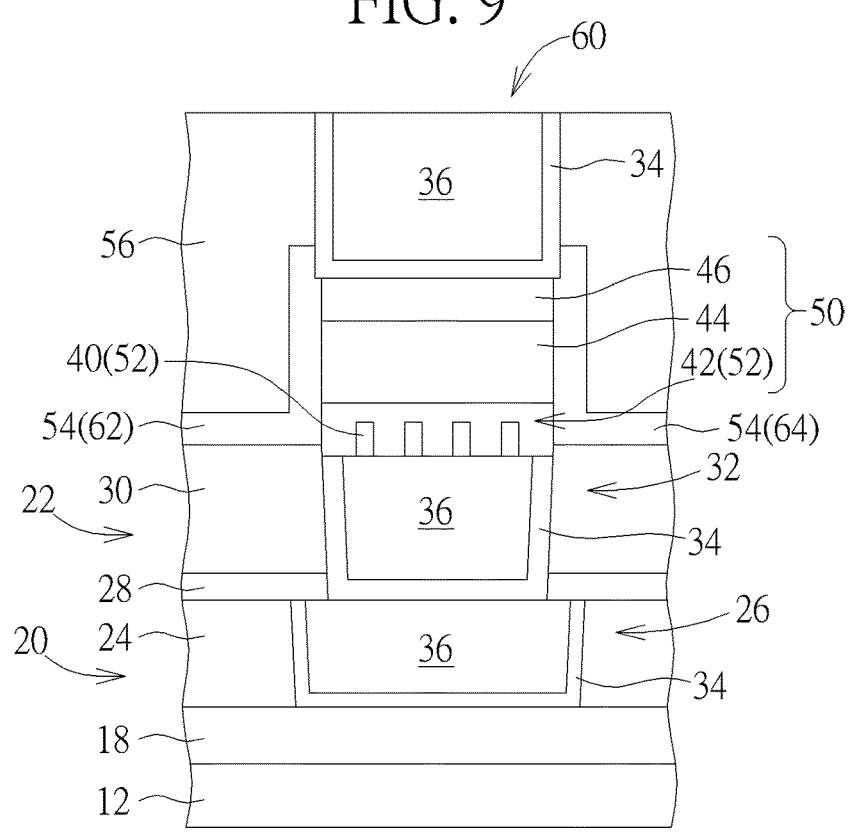
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, contrast to the top surface of the metal interconnection 32 or metal layer 36 around the protrusions 40 being even with the top surface of the adjacent IMD layer 30, according to other embodiment of the present invention, it would be desirable to conduct the aforementioned $NH_3$ plasma treatment process to roughen the top surface of the metal interconnection 32 to form the protrusions 40 and at the same time remove part of the metal layer 36 and/or part of the barrier layer 34 surrounding the protrusions 40 so that the top surface of the metal layer 36 and/or barrier layer 34 of the metal interconnection 32 surrounding the protrusions 40 could be slightly lower than the top surface of the IMD layer 30 while the top or topmost surface of the protrusions 40 is still higher than the top surface of the IMD layer 30, which is also within the scope of the present invention.

Overall, the present invention first forms a metal interconnection in an IMD layer and then conducts a treatment process on the surface of the metal interconnection to roughen the surface of the metal interconnection and at the same time form multiple protrusions made of same material such as copper or tungsten as the metal interconnection. Next, a bottom electrode layer, a CNT layer, and a top electrode layer are formed on the metal interconnection to form a nano-ram (NRAM), in which the protrusions formed by the aforementioned roughening process and the original bottom electrode layer together constitute a new composite bottom electrode. By using the above toughening treatment process to form a composite bottom electrode having protrusions, it would desirable to lower the work function and improve energy consumption for the entire memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first metal interconnection in a first inter-metal dielectric (IMD) layer;
    performing a treatment process to roughen a top surface of the first metal interconnection without roughening sidewalls of the first metal interconnection for forming protrusions on a top surface of the first metal interconnection, wherein the protrusions expose part of the top surface of the first metal interconnection, each of a bottom surface and a top surface of the protrusions comprise a planar surface, the bottom surface of the protrusions is lower than a top surface of the first IMD layer, and the top surface of the protrusions is higher than a top surface of the first IMD layer; and
    forming a carbon nanotube (CNT) junction on the first metal interconnection.

2. The method of claim 1, wherein the treatment process comprises a $NH_3$ plasma treatment process.

3. The method of claim 1, wherein the protrusions and the first metal interconnection comprise same material.

4. The method of claim 1, wherein the protrusions and the first metal interconnection comprise copper (Cu) or tungsten (W).

5. The method of claim 1, further comprising
    forming a bottom electrode layer on the first IMD layer, the protrusions, and the first metal interconnection;
    forming a carbon nanotube (CNT) layer on the bottom electrode layer;
    forming a top electrode layer on the CNT layer; and
    patterning the top electrode layer, the CNT layer, and the bottom electrode layer to form the CNT junction.

6. The method of claim 5, further comprising:
    forming a cap layer on the first IMD layer and the CNT junction;
    forming a second IMD layer on the cap layer; and
    forming a second metal interconnection in the second IMD layer and the cap layer to electrically connect the CNT junction.

7. A semiconductor device, comprising:
    a first metal interconnection in a first inter-metal dielectric (IMD) layer;
    protrusions on the first metal interconnection, wherein the protrusions expose part of a top surface of the first metal interconnection, each of a bottom surface and a top surface of the protrusions comprise a planar surface, the bottom surface of the protrusions is lower than a top surface of the first IMD layer and the top surface of the protrusions is higher than a top surface of the first IMD layer; and
    a carbon nanotube (CNT) junction on the first metal interconnection, wherein the CNT junction comprises:
        a bottom electrode layer on and directly contacting the protrusions and the first metal interconnection;
        a CNT layer on the bottom electrode layer; and
        a top electrode layer on the CNT layer.

8. The semiconductor device of claim 7, further comprising:
    a second metal interconnection on the CNT junction;
    a cap layer on a sidewall of the CNT junction and on the first IMD layer; and
    a second IMD layer on the cap layer and around the second metal interconnection.

9. The semiconductor device of claim 8, wherein the cap layer comprises:

a first L-shaped portion on one side of the CNT junction; and a second L-shaped portion on another side of the CNT junction.

10. The semiconductor device of claim 8, wherein the cap layer contacts the CNT junction and the second metal interconnection directly.

11. The semiconductor device of claim 7, wherein the protrusions and the first metal interconnection comprise same material.

12. The semiconductor device of claim 7, wherein the protrusions and the first metal interconnection comprise copper (Cu) or tungsten (W).

* * * * *